United States Patent
Francis et al.

(10) Patent No.: US 10,998,864 B1
(45) Date of Patent: May 4, 2021

(54) NON-LINEARITY CORRECTION

(71) Applicant: Xilinx, Inc., San Jose, CA (US)

(72) Inventors: Roswald Francis, Dublin (IE); Christophe Erdmann, Dublin (IE)

(73) Assignee: Xilinx, Inc, San Jose, CA (US)

( * ) Notice: Subject to any disclaimer, the term of this patent is extended or adjusted under 35 U.S.C. 154(b) by 0 days.

(21) Appl. No.: 16/583,789

(22) Filed: Sep. 26, 2019

(51) Int. Cl.
*H03F 1/32* (2006.01)
*H03F 3/45* (2006.01)

(52) U.S. Cl.
CPC ......... *H03F 1/3211* (2013.01); *H03F 1/3205* (2013.01); *H03F 3/45269* (2013.01)

(58) Field of Classification Search
CPC .................................................... H03F 1/3223
USPC ................................................. 330/151, 149
See application file for complete search history.

(56) References Cited

U.S. PATENT DOCUMENTS 5,552,730 A * 9/1996 Deguchi ............. H03F 3/45197
327/103
7,693,497 B2 * 4/2010 Wilkinson ............ H03F 1/3229
455/127.1

* cited by examiner

*Primary Examiner* — Henry Choe
(74) *Attorney, Agent, or Firm* — Paradice and Li LLP

(57) ABSTRACT

An apparatus for generating an output current including a first distortion current based on a first transconductance and a second distortion current based on a second transconductance is disclosed. The first distortion current may be generated by an amplifier and the second distortion current may be generated by a distortion compensator. The second transconductance may be less than the first transconductance. In some implementations, the second distortion current may reduce the first distortion current output by the apparatus.

16 Claims, 5 Drawing Sheets

NON-LINEARITY CORRECTION

TECHNICAL FIELD

Aspects of the present disclosure generally relate to analog transistor circuits, and specifically to non-linearity current correction for MOSFET buffer and amplifier circuits.

BACKGROUND

Metal-oxide-silicon field effect-transistors (MOSFETs) have become the de facto transistor for use in digital electronics. MOSFETs are space efficient and have a very low quiescent current, especially compared to bipolar transistors. Some electronic designs may have a combination of digital and analog signal processing circuits. For example, some integrated circuits may include analog inputs, an analog-to-digital converter, as well as digital circuits such as memories, logic blocks and the like.

By combining analog and digital circuits in a single integrated circuit, a monolithic device can be realized using a single fabrication process. While MOSFETs are a natural fit for digital circuits, some MOSFET-based analog signal processing circuits may have a partial non-linear response or transfer function. This non-linear response may include, for example, distortion (e.g., one or more distortion products) that affect the accuracy of the analog signal processing circuit.

Therefore, there is a need for a MOSFET-based analog buffer or amplifier with reduced non-linear distortion.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter described in this disclosure can be implemented in an apparatus including at least an amplifier and a distortion compensator. The apparatus may be configured to generate an output current based on a first transconductance, where the output current includes a first distortion current. The apparatus may also be configured to generate a second distortion current based on a second transconductance, where the second transconductance is less than the first transconductance. In some implementations, the amplifier may be configured to receive a differential input voltage and to generate a differential output current based on the first transconductance. In addition, or in the alternative, the distortion compensator may include first and second transistors biased by a current source and configured to generate the second distortion current. In some aspects, the second distortion current may reduce the first distortion current.

In some implementations, the amplifier may include two or more metal-oxide-silicon field effect transistors (MOSFETs) configured to generate the output current based on the first transconductance, and the distortion compensator may include a first transistor and a second transistor biased by a current source and configured to generate the second distortion current. In some aspects, the first transistor and the second transistor may have a different aspect ratio, as compared to the two or more MOSFETs provided in the amplifier. In addition, or in the alternative, a fundamental current of the distortion compensator may be less than a fundamental current from the amplifier.

Another innovative aspect of the subject matter described in this disclosure can be implemented as a method for operating an apparatus including at least an amplifier and a distortion compensator. The method may include generating an output current in the amplifier based on a first transconductance, wherein the output current includes a first distortion current; and generating a second distortion current in the distortion compensator based on a second transconductance, wherein the second transconductance is less than the first transconductance. In some implementations, the output current may be generated by receiving a differential input voltage and generating a differential output current based on the first transconductance. In some aspects, the second distortion current may reduce the first distortion current.

In some implementations, the amplifier may include two or more MOSFETs configured to generate the output current based on the first transconductance, and the distortion compensator may include first and second transistors biased by a current source and configured to generate the second distortion current. In some aspects, the first transistor and the second transistor may have a different aspect ratio, as compared to the two or more MOSFETs. In addition, or in the alternative, a fundamental current of the distortion compensator is less than a fundamental current from the amplifier.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Aspects of the present disclosure disclose an analog amplifier system configured to generate an output current with reduced distortion. The analog amplifier system may include a transimpedance or voltage amplifier and a distortion compensator. The transimpedance or voltage amplifier may generate an output voltage based on an input voltage or current. The output current may include a first distortion current. The distortion compensator may generate a second distortion current based on a second transconductance. The second distortion current may reduce or cancel the first distortion current.

Figure 1:
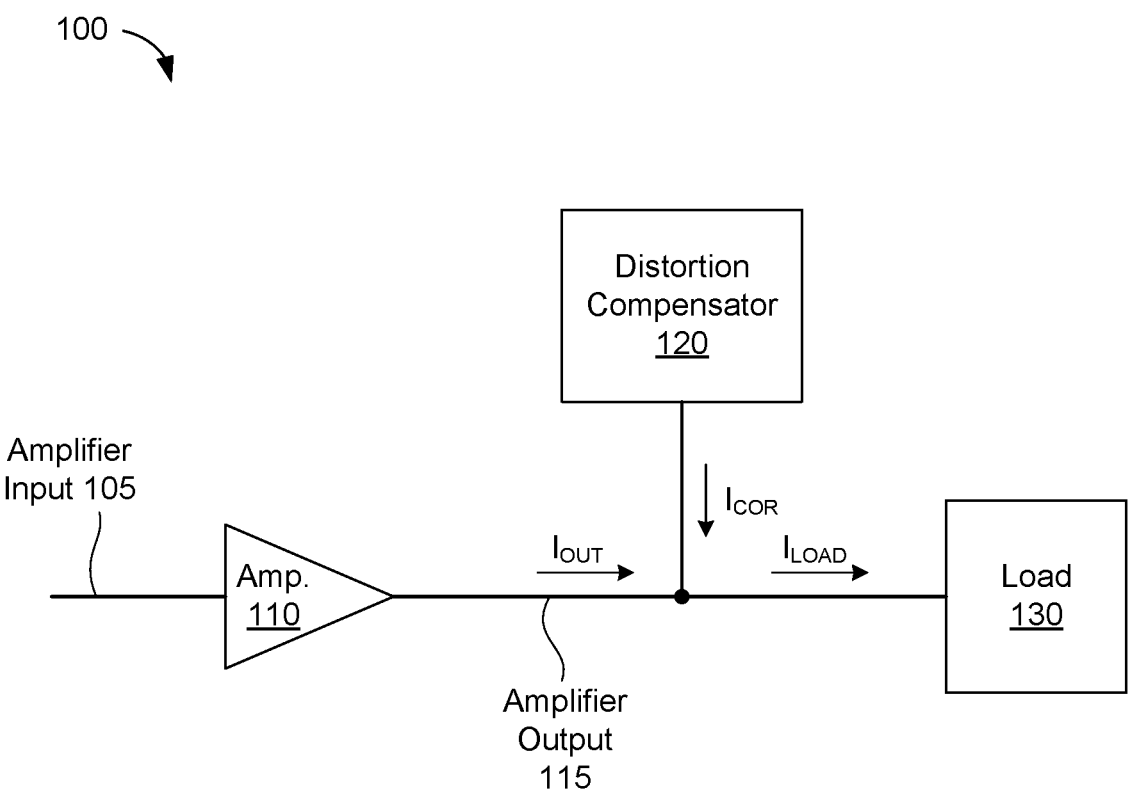
FIG. 1 shows a simplified block diagram of an example metal-oxide-silicon field effect transistor (MOSFET) analog amplifier system.

FIG. 1 shows a simplified block diagram of an example metal-oxide-silicon field effect transistor (MOSFET) analog amplifier system 100. The MOSFET analog amplifier system 100 may include an amplifier 110, a distortion compensator 120, and a load 130. The MOSFET analog amplifier system 100 may generate a amplifier output signal 115 for the load 130 based on a amplifier input signal 105. The amplifier 110 may be a MOSFET-based buffer, inverter, amplifier, or the like. In some implementations, the amplifier input signal 105 and the amplifier output signal 115 may be differential signals. Thus, the amplifier 110, the distortion compensator 120, and the load 130 may each transmit, receive, amplify, generate and/or buffer differential signals (differential signals not shown for simplicity).

The amplifier 110 may include any number of NMOS and/or PMOS transistors (not shown for simplicity). In some implementations, a feedback resistor 112 may feedback a portion of the amplifier output signal 115 to an input of the amplifier 110. Such a feedback signal may be used to control gain or enhance stability of the amplifier 110.

The load 130 may be any feasible device, component, circuit or the like to receive the amplifier output signal 115. For example, the load 130 may be an analog-to-digital converter that includes a sample and hold interface. The load 130 may be characterized by an input/load resistance, a load capacitance, a load inductance, and/or a transient response. For example, the load 130 may include a periodically operated sample and hold interface with an associated transient response based on a periodic charging and discharging of a load capacitance.

In some implementations, the distortion compensator 120 may reduce distortion of the MOSFET analog amplifier system 100 by introducing one or more signals to counteract or cancel the distortion components in the second portion of the amplifier output signal 115. For example, the amplifier output signal 115 provided by the amplifier 110 may be an output current that includes a first portion and a second portion. The first portion may include fundamental current such as a main or desired output current. The second portion may include one or more undesired harmonic or distortion currents. The harmonic or distortion currents may be non-linear and may cause the amplifier output signal 115 to be at least partially non-linear with respect to the amplifier input signal 105. The distortion compensator 120 may generate a correction current $I_{COR}$ that is summed with the output current $I_{OUT}$ to generate a corrected load current $I_{LOAD}$. Thus, the correction current $I_{COR}$ may include components that when added to the output current $I_{OUT}$ may reduce or eliminate distortion currents or harmonic currents (e.g., non-linear currents) in the load current $I_{LOAD}$. In some implementations, the load current LOAD may be expressed as:

$$I_{OUT} + I_{COR} = I_{LOAD} \quad \text{[eq. 1]}$$

Undesired harmonic and/or distortion components are described in more detail below in conjunction with FIG. 2. The distortion compensator 120 is described in more detail below in conjunction with FIGS. 2, 3A, and 3B.

Figure 2:
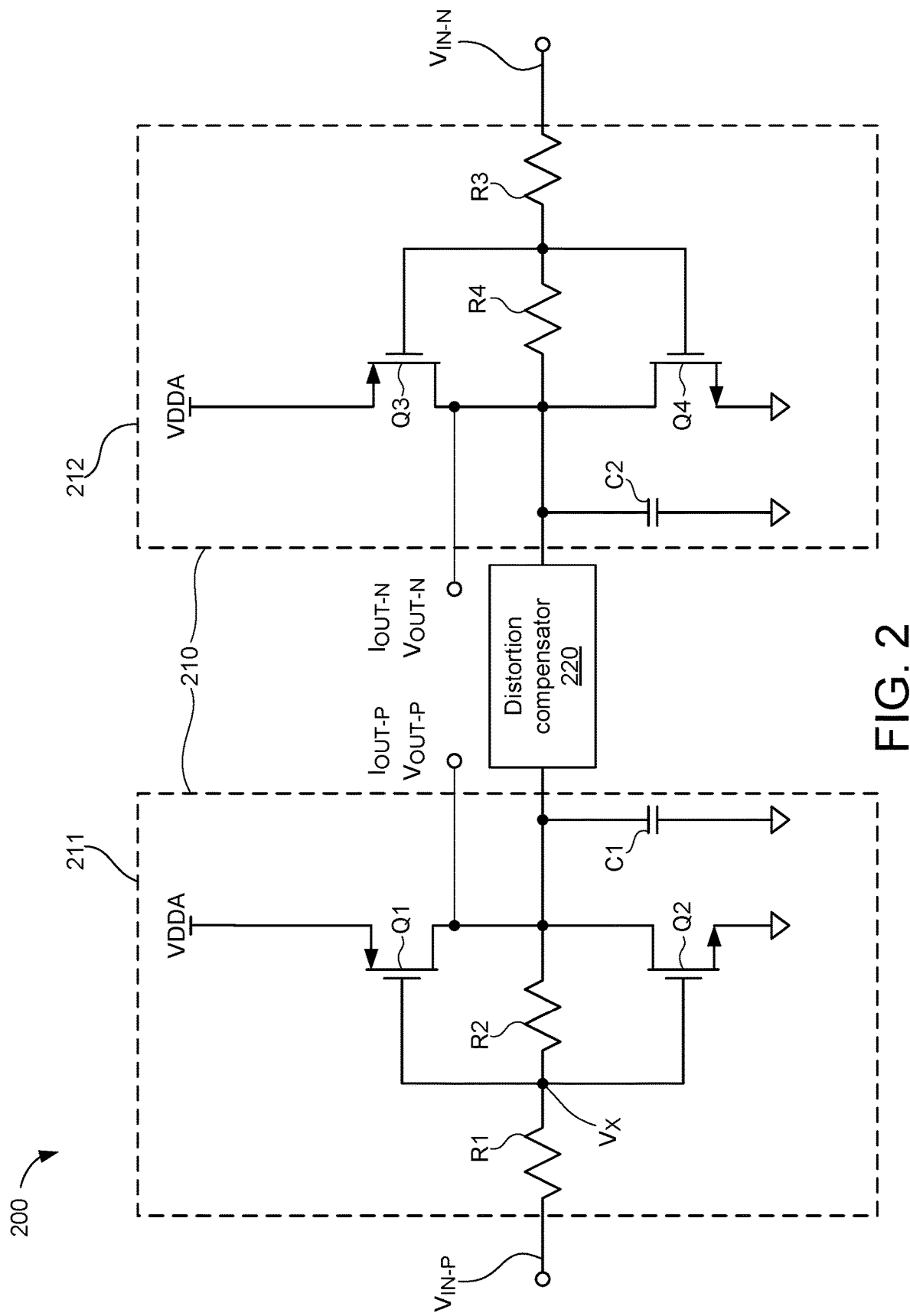
FIG. 2 shows simplified circuit diagram of an example CMOS amplifier and distortion compensator.

FIG. 2 is simplified circuit diagram 200 of an example CMOS amplifier 210 and distortion compensator 220. The CMOS amplifier 210 may be an implementation of the amplifier 110, and the distortion compensator 220 may be an implementation of the distortion compensator 120, both of FIG. 1. The CMOS amplifier 210, which may be a differential amplifier, may receive a differential input voltage $V_{IN}$ and generate a differential output current $I_{OUT}$ in response thereto. The input voltage $V_{IN}$ may include a first input signal $V_{IN-P}$ and a second input signal $V_{IN-N}$. The first input signal $V_{IN-P}$ may have an equal but opposite magnitude with respect to the second input signal $V_{IN-n}$. Similarly, the output current $I_{OUT}$ may include a first output current $I_{OUT-P}$ and a second output current $I_{OUT-N}$. Thus, the first output current $I_{OUT-P}$ may have an equal but opposite magnitude with respect to the second output current $I_{OUT-N}$.

The CMOS amplifier 210 may include a first section 211 to process the first input signal $V_{IN-P}$, and may include a second section 212 to process the second input signal $V_{IN-N}$. The first section 211 may include a first resistor R1, a second resistor R2, a first transistor Q1, a second transistor Q2, and a first capacitance C1. The first transistor Q1 may be a PMOS transistor, and the second transistor Q2 may be an NMOS transistor. A drain of the first transistor Q1 may be coupled to a drain of the second transistor Q2. A source of the second transistor Q2 may be coupled to ground. The gate terminals of the first transistor Q1 and the second transistor Q2 may be coupled together. The first resistor R1 may function as an input resistor, and the second resistor R2 may function as an output resistor for the first section 211.

The first input signal $V_{IN-P}$ may be received by a first terminal of the first resistor R1. A second terminal of the first resistor R1 may be coupled to the gates of the first transistor Q1 and the second transistor Q2. A first terminal of the second resistor R2 may be coupled to the second terminal of first resistor R1. A second terminal of the second resistor R2 may be coupled to the drain terminals of the first transistor Q1 and second transistor Q2.

In some implementations, an optional level shifter (not shown for simplicity) may be inserted between the gates of the first transistor Q1 and the second transistor Q2 and the second terminal of the first resistor R1. The level shifters may enable the first input signal $V_{IN-P}$ to have a suitable voltage with respect to any threshold voltages associated with the first transistor Q1 and the second transistor Q2.

A source of the first transistor Q1 may be coupled to a supply voltage denoted as VDDA in FIG. 2. The supply voltage may be any suitable supply voltage for operating the first transistor Q1 and the second transistor Q2. In some implementations, a current through the first transistor Q1 and the second transistor Q2 may be approximately 23 mA.

The first capacitor C1 may be a discrete or parasitic capacitor associated with the first section 211. In some implementations, the first capacitor C1 may be a load capacitance or output capacitance associated with the first section 211.

The first section 211 may operate as a CMOS amplifier that receives an input voltage and generates an output current based at least in part on the input voltage. Output current of a MOSFET, such as the CMOS amplifier of the first section 211, may be based on a voltage-to-current gain factor often referred to as transconductance ($g_m$). In some implementations, the transconductance may be positive, negative or unity. Output current of the first section 211 may be expressed using a Taylor-series expansion describing output current of MOSFET transistors. In some aspects, the output current $I_{OUT-P}$ may be expressed by the equation below:

$$I_{OUT-P} = g_m V_{gs} + g_{m2} V_{gs}^2 + g_{m3} V_{gs}^3 + \ldots \quad [\text{eq. 2}]$$

where: $g_m$ is a first transconductance;
$g_{m2}$ is a second transconductance;
$g_{m3}$ is a third transconductance; and
$V_{gs}$ is a gate voltage of a MOSFET.

The first term ($g_m V_{gs}$) of equation 2 describes the fundamental current, that is, the main linear output current of the first section 211. Equation 2 also includes a second term ($g_{m2} V_{gs}^2$) that describes a second-harmonic or distortion current and a third term ($g_{m3} V_{gs}^3$) that describes a third-harmonic or distortion current. The harmonic or distortion currents may be non-linear currents. The Taylor-series expansion may include other terms describing other harmonics or distortions but are not included here for simplicity (e.g., since those other terms may not contribute significantly to the current $I_{OUT-P}$).

In some implementations, an output voltage of the first section 211 may be expressed by the equation below:

$$V_{OUT-P} = -k V_x \quad [\text{eq. 3}]$$

where: $V_{OUT-P}$ is the output voltage;
$-k$ is a gain factor associated with the first section 211; and
$V_x$ is the gate voltage of the first transistor Q1 and the second transistor Q2.

The gain factor k may be negative (as in equation 3) when the first section 211 implements an inverting buffer or inverting amplifier. In addition, or in the alternative, the gain factor k may be proportional to the transconductance $g_m$ of the transistors in the first section 211 and an associated feedback resistor:

$$k \sim g_m R \quad [\text{eq. 4}]$$

In the example of FIG. 2, the first transistor Q1 and the second transistor Q2 may be configured to carry a 23 mA current. Since $g_m$ of the first transistor Q1 and the second Q2 may be proportional to drain-to-source current, the 23 mA bias current may provide a net $g_m$ for the first transistor Q1 and the second transistor Q2 of approximately 680 millisiemens. In some aspects, the feedback resistor R may be the second resistor R2 in the first section 211. The value of the second resistor R2 may be 50 ohms. Thus, the gain factor k (using equation 4) may be approximately 34 (e.g., 680 millisiemens*50 ohms). Note that the 680 millisiemens transconductance value for $g_m$ and the 50 ohm resistance value of the resistor R2 are illustrative values and are not meant to limit any implementation. Other transconductance and resistance values may be used.

The gain factor k may also depend on current flow through the feedback resistor R with respect to available output current. For example, some output current from the first section 211 may flow to the first capacitor C1, the distortion compensator 220, and/or the load (not shown). Diverting the output current away from the second resistor R2 may reduce the gain factor k. In some implementations, the gain factor k may be reduced by half because of current diversion, and therefore the example gain factor of 34 discussed above may be reduced to approximately 17.

The second section 212 may be similar to the first section 211. For example, second section 212 may include a third resistor R3, a fourth resistor R4, a third transistor Q3, a fourth transistor Q4, and a second capacitance C2. The third resistor R3, the fourth resistor R4, the third transistor Q3, the fourth transistor Q4, and the second capacitance C2, may be configured in a similar manner as the first resistor R1, the second resistor R2, the first transistor Q1, the second transistor Q2, and the first capacitance C1, the first section 211, respectively. Similar to the first section 211, the second section 212 may also operate as an amplifier. The second input signal $V_{IN-N}$ may be coupled to the third resistor R3. The second output current $I_{OUT-N}$ and second output voltage $V_{OUT-N}$ may be supplied by the third transistor Q3 and the fourth transistor Q4. In some aspects, second output current $I_{OUT-N}$ may be described by equation 2, and the second output voltage $V_{OUT-N}$ may be described by equation 3.

As shown, the CMOS amplifier 210 is implemented as differential amplifier using the first section 211 to process a first half of a differential signal and using the second section 212 to process a second half of the differential signal. Persons skilled in the art will appreciate that even order harmonic and distortion components (for example, the $g_{m2} V_{gs}^2$ term of equation 2) may be eliminated within the CMOS amplifier 210 due to the well-known cancellation of even order, non-linear components of differential signals through differential signal processing.

The distortion compensator 220 may receive the output signals from the first section 211 and the second section 212. The distortion compensator 220 may cancel, at least in part, odd order harmonics and/or distortions in the output signals, and thereby improve the linearity of the output of the CMOS amplifier 210. Thus, in some implementations, the distortion compensator 220 may provide current to reduce or cancel the third ($g_{m3} V_{gs}^3$) term of equation 2. Cancellation of the third-order harmonic/distortion term of equation 2 is discussed in more detail below in conjunction with FIG. 3.

Figure 3A:
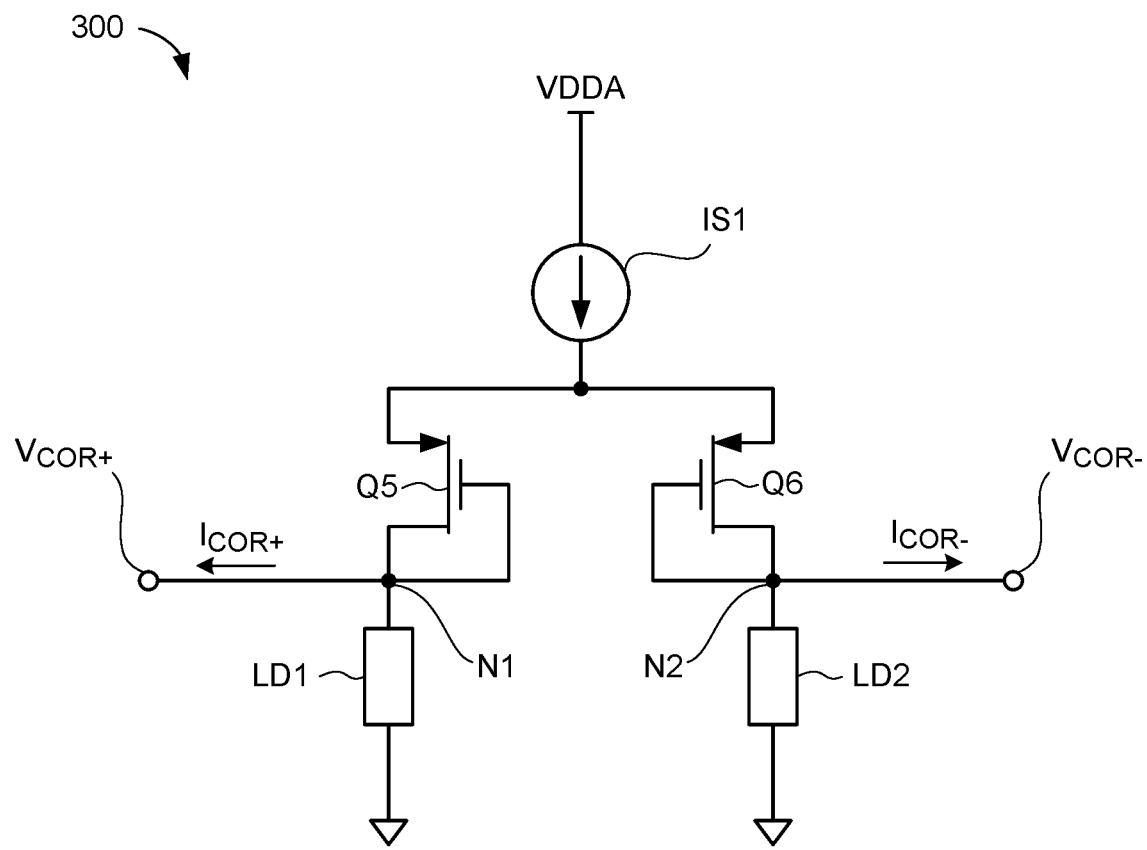
FIG. 3A shows a simplified circuit diagram of an example distortion compensator.

FIG. 3A shows a simplified circuit diagram of an example distortion compensator 300. The distortion compensator 300 may be an implementation of the distortion compensator 120 of FIG. 1 or the distortion compensator 220 of FIG. 2. The distortion compensator 300 may include a fifth transistor Q5, a sixth transistor Q6, a first current source IS1, a first load LD1, and a second load LD2. As shown, the fifth transistor Q5 and the sixth transistor Q6 may be implemented as PMOS transistors. In other implementations, the fifth transistor Q5 and the sixth transistor Q6 may be any other feasible type of transistor, such as NMOS transistors.

The fifth transistor Q5 and sixth transistor Q6 may be similar to the transistors used in the CMOS amplifier 210 of FIG. 2. For example, the fifth transistor Q5 and sixth transistor Q6 may have a similar channel length or width, similar P and N dopant concentrations, and the like as one or more of the transistors Q1-Q4. In some implementations, the fifth transistor Q5 and the sixth transistor Q6 may be the same as the transistors Q1-Q4 except having different aspect ratios (e.g., the relationship between transistor channel length and width.) The first current source IS1 may supply a bias current that is shared between the fifth transistor Q5 and sixth transistor Q6. For one example implementation, the first current source IS1 may supply two milliamps of current that may be split between the fifth transistor Q5 and sixth transistor Q6. Thus, the fifth transistor Q5 and sixth transistor Q6 may each carry one mA of current in this example implementation. The first current source IS1 may be coupled to a source of the fifth transistor Q5 and sixth transistor Q6. A drain of fifth transistor Q5 may be coupled to ground through the first load LD1, and a drain of sixth transistor Q6 may be coupled to ground through the second load LD2. The first load LD1 and the second load LD2 may include any technically feasible active or passive devices or components. For example, the first load LD1 and second load LD2 may include similarly valued resistors to couple the drains of the fifth transistor Q5 and sixth transistor Q6 to ground.

In some implementations, the fifth transistor Q5 and sixth transistor Q6 may be configured as diode-connected transistors. For example, the gate and the drain of the fifth transistor Q5 may be connected together (shown at node N1). The fifth transistor Q5 may generate a correction current $I_{COR+}$ through node N1. A correction voltage $V_{COR+}$ may result at the node N1 based at least in part on the correction current $I_{COR+}$ and an impedance seen at the node N1 from, for example, the first section 211. Similarly, the gate and drain of the sixth transistor Q6 may be connected together (shown at node N2). The sixth transistor Q6 may generate a correction current $I_{COR-}$ through node N2. A correction voltage $V_{COR-}$ may result at the node N2 based at least in part on the correction current $I_{COR-}$ and an impedance seen at the node N2 from, for example, the second section 212. In some implementations, the correction currents $I_{COR+}$ and $I_{COR-}$ and the correction voltages $V_{COR+}$ and $V_{COR-}$ may be differential currents and voltages, respectively.

As discussed above with respect to equation 2, output current of a MOSFET circuit may be generally expressed using a Taylor series expansion equation. Thus, the correction current $I_{COR+}$ may be expressed by:

$$I_{COR+} = b_1 V_O + b_2 V_O^2 + b_3 V_O^3 + \ldots \quad [\text{eq. 5}]$$

where: $I_{COR+}$ is the output correction current;
b1, b2, b3 ... are coefficients associated with fundamental and distortion/harmonic currents; and
$V_O$ is an output voltage (e.g., the voltage at nodes N1 and N2)

The first term ($b_1 V_O$) may describe the fundamental current of the distortion compensator 300_. The second term ($b_2 V_O^2$) may describe a second-harmonic or distortion current, and the third term ($b_3 V_O^3$) may be a third-harmonic or distortion current. Equation 5 may include other terms describing other harmonics or distortions but are not included here for simplicity (e.g., since those other terms may not contribute significantly to the output current $I_{COR+}$).

In a similar manner as described for $I_{COR+}$ above, output current $I_{OUT+}$ from the first section 211 may be expressed by the equation:

$$I_{OUT+} = a_1 V_x + a_2 V_x^2 + a_3 V_x^3 + \ldots \quad [\text{eq. 6}]$$

where $a_1, a_2, a_3, \ldots$ are coefficients associated with fundamental and distortion/harmonic output currents; and
$V_x$ is the gate voltage of the first transistor Q1 and the second transistor Q2.

The first term ($a_1 V_x$) may describe fundamental current provided by the first section 211. The second term ($a_2 V_x^2$) may describe a second-harmonic or distortion current, and the third term ($a_3 V_x^3$) may describe a third-harmonic or distortion current. In some aspects, a1 may be determined by the transconductance of the first transistor Q1 and the second transistor Q2. Thus, in some implementations, $a_1 = (g_m$ of the first transistor Q1$) + (g_m$ of the second transistor Q2$)$. Equation 6 may include other terms to describe other harmonics or distortions but are not included here since those other terms may not contribute significantly to the output current $I_{OUT+}$.

Referring also to equation 3, a voltage output of the first section 211 may be expressed by the equation:

$$V_{OUT-P} = -k V_x \quad [\text{eq. 7}]$$

Substituting equation 7 into equation 6, dropping even harmonic/distortion terms, and truncating the Taylor series to terms related to the third-harmonic provides the equation:

$$I_{COR+} = -b_1 k V_x - b_3 k^3 V_x^3 \quad [\text{eq. 8}]$$

Equation 1 states:

$$I_{OUT+} + I_{COR+} = I_{LOAD+} \quad [\text{eq. 9}]$$

Substituting equations 6 and 8 into equation 9:

$$I_{LOAD+} = (a_1 - b_1 k) V_x + (a_3 - b_3 k^3) V_x^3 \quad [\text{eq. 10}]$$

where: $V_x$ is the gate voltage of the first transistor Q1 and the second transistor Q2 in the first section 211;
$(a_1 - b_1 k)$ is a coefficient describing the fundamental current of $I_{LOAD+}$; and
$(a_3 - b_3 k^3)$ is a coefficient describing a third-harmonic or distortion current of $I_{LOAD+}$.

The a1 and a3 terms may be determined by the first section 211, and the b1 and b3 terms may be determined by the distortion compensator 300. In particular, b1 may be based on the transconductance of the fifth transistor Q5.

Transconductance may be directly proportional to transistor current. As discussed with respect to FIG. 2, the first current source IS1 may provide 23 mA of current to first transistor Q1 and the second transistor Q2. However, in the drain-to-drain configuration shown in FIG. 2, current from the first transistor Q1 may be "reused" by the second transistor Q2. Thus, the 23 mA transistor current becomes an effective 46 mA. The bias current in the fifth transistor Q5 and the sixth transistor Q6 is less than 1/20 the effective current in the first transistor Q1 and the second transistor Q2. Comparing the effective 46 mA to the one mA of current through the fifth transistor Q5, the transconductance a1 is 46 times larger than the transconductance b1.

Transconductance may be inversely proportional to transistor gate voltage. For example, if a first gate voltage for a first transistor is twice as large as a second gate voltage for second transistor, where the first and second transistors are otherwise similar, and the first gate voltage and the second gate voltage are both greater than the transistor threshold voltage, then the transconductance of the second transistor will be greater than the transconductance of the first transistor. In other words, transconductance may be inversely proportional to "overdrive" voltage (e.g., the difference between gate voltage and threshold voltage). The overdrive voltage of the fifth transistor Q5 may be greater than the overdrive voltage of the first transistor Q1 and/or the second transistor Q2. Persons skilled in the art will recognize that the overdrive of the fifth transistor Q5 may be determined at least in part by an aspect ratio of the fifth transistor Q5 compared to the second transistor Q2.

Because the ratio of transistor current in the first section 211 is 46 times greater than the transistor current in the distortion compensator 300, and because overdrive voltage of the fifth transistor Q5 is greater than overdrive voltage of the first transistor Q1 and/or the second transistor Q2, the transconductance associated with the first transistor Q1 and the second transistor Q2 may be greater that the transconductance associated with the fifth transistor Q5. In other words, the fundamental current of the first section 211 is greater than the fundamental current of the distortion compensator 300 (e.g., $a_1 \gg b_1 k$). Thus, the coefficient in equation 10 describing the fundamental current may be simplified from $(a_1 - b_1 k)$ to $a_1$. Therefore, the fundamental current of the combined amplifier 110 and the distortion compensator 300 may be substantially be a function of the transconductance of the first transistor Q1 and the second transistor Q2.

Furthermore, in equation 10, the third-harmonic or distortion current may be determined by $(a_3 - b_3 k^3)$ where a3 is associated with the first transistor Q1 and the second transistor Q2, and b3 is associated with the fifth transistor Q5. In some implementations, a3 may be a large value (compared to b3) contributed by the amplifier 110, but may be a small quantity (compared to a1) since a1 is associated with the fundamental current discussed above. Thus, (a3/a1) may describe distortion associated with the amplifier 110.

On the other hand, b3 may be a relatively small value based on a low current carrying element (the fifth transistor Q5) compared to a3 which may be based on a relatively higher current carrying elements (the first transistor Q1 and the second transistor Q2). However, b3 may be sufficiently large with respect to b1 (based on a fundamental current associated with the fifth transistor Q5). In other words, (a3/a1)<(b3/b1).

As $b_3 k^3$ increases to be comparable to a3, the overall third-harmonic or distortion current may be reduced or cancelled. In some implementations, the value of b3 alone may not be comparable to a3. Note, however, that the value of b3 is multiplied by $k^3$. As discussed in the example of FIG. 2, k may be approximately 17, thus the $k^3$ term becomes 2023. In this manner, the third-harmonic and/or distortion current is reduced or cancelled.

Operation of the sixth transistor Q6 in conjunction with the second section 212 may be similar to the operation of the fifth transistor Q5 in conjunction with the first section 211. Notably, since the second section 212 and the sixth transistor Q6 process the second half of the differential input signal VIN, currents and voltages described with respect to the first section 211 and the fifth transistor Q5 may be an equal magnitude but of an opposite polarity to currents and voltages associated with the second section 212 and the sixth transistor Q6. Generally, differential signals for the amplifier 110 and the distortion compensator 300 may be expressed by the equations below:

$$I_{LOAD} = (I_{LOAD+} \pm I_{LOAD-}) * 0.5 \quad [\text{eq. 11}]$$

where $I_{LOAD+}$ and $I_{LOAD-}$ are based on equation 10.

$$I_{COR} = (I_{COR+} \pm I_{COR-}) * 0.5 \quad [\text{eq. 12}]$$

where $I_{COR+}$ and $I_{COR-}$ are based on equation 8.

$$I_{OUT} = (I_{OUT+} \pm I_{OUT-}) * 0.5 \quad [\text{eq. 13}]$$

where $I_{OUT+}$ and $I_{OUT-}$ are based on equation 6.

The distortion compensator 300, therefore, generates a correction current $I_{COR}$ to reduce or cancel harmonic or distortion currents within $I_{OUT}$. The correction current $I_{COR}$ may advantageously be added to the output current $I_{OUT}$ anywhere between the output of the first section 211, the second section 212, and the load. Thus, placement of the distortion compensator 300 may be flexible and not limited by trace length or a mandatory proximity to the first section 211, the second section 212, and the load. Furthermore, the relatively low transconductance of the distortion compensator 300 (compared to the first section 211 and the second section 212) may have a negligible effect on operation points, noise, loop properties, signal attenuation and the like of the first section 211 and the second section 212.

Figure 3B:
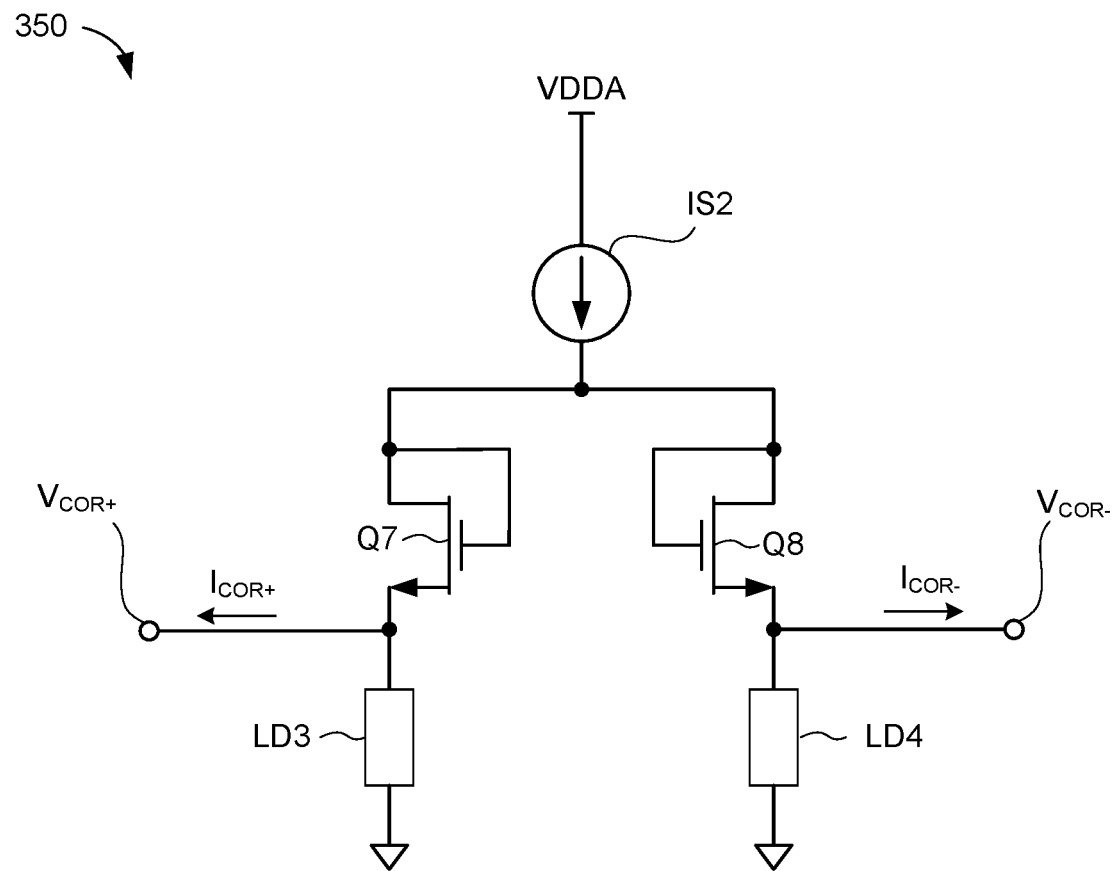
FIG. 3B shows a simplified circuit diagram of another example distortion compensator.

FIG. 3B shows a simplified circuit diagram of another example distortion compensator 350. The distortion compensator 350 may be an implementation of the distortion compensator 120 of FIG. 1 or the distortion compensator 220 of FIG. 2. The distortion compensator 350 may include a seventh transistor Q7, an eighth transistor Q8, a second current source IS2, a third load LD3, and a fourth load LD4. As shown, the seventh transistor Q7 and the eighth transistor Q8 may be implemented as NMOS transistors.

The seventh transistor Q7 and the eighth transistor Q8 may be similar (have similar physical dimensions, doping concentrations, etc.) as the transistors used in the CMOS amplifier 210 of FIG. 2. The second current source IS2 may generate a bias current that is split between the seventh transistor Q7 and the eighth transistor Q8. A source of seventh transistor Q7 may be coupled to the second current source IS2 and a source of the eighth transistor Q8 may be coupled to the second current source IS2. The third load LD3 may couple the drain of the seventh transistor Q7 to ground and the fourth load LD4 may couple the drain of the eighth transistor Q8 to ground. The third load LD3 and fourth load LD4 may include any technically feasible active or passive devices or components.

Operation of the distortion compensator 350 may be similar to operation of the distortion compensator 300. That is, the seventh transistor Q7 and the eighth transistor Q8 may generate a correction current $I_{COR}$ similar to as expressed in equation 8. The correction current $I_{COR}$ may be added to amplifier output current $I_{OUT}$ similar to as expressed in equation 9. A load current $I_{LOAD}$ may be generated with reduced or canceled harmonic and/or distortion currents similar to as expressed in equation 10.

Figure 4:
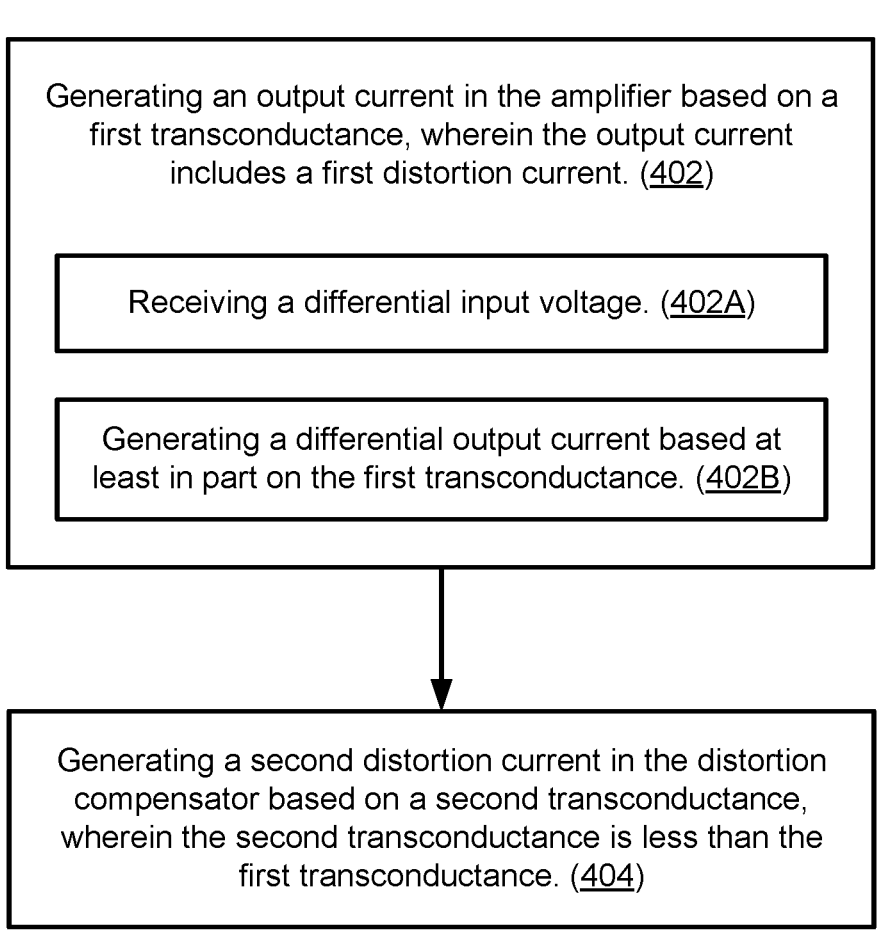
FIG. 4 shows an illustrative flow chart depicting an example operation for operating an apparatus including at least an amplifier and a distortion compensator, in accordance with some implementations.

FIG. 4 shows an illustrative flow chart depicting an example operation 400 for operating an apparatus including at least an amplifier and a distortion compensator, in accordance with some implementations. The example operation 400 is described below with respect to the CMOS amplifier 210 of FIG. 2 and the distortion compensator 300 of FIG. 3A for illustrative purposes only. It is to be understood that the example operation 400 may be performed by other suitable devices and apparatuses disclosed herein. The operation 400 may begin at block 402 by generating an output current in the amplifier 210 based on a first transconductance, wherein the output current includes a first distortion current. The operation 400 may proceed at block 404 by generating a second distortion current in the distortion compensator 300 based on a second transconductance, wherein the second transconductance is less than the first transconductance.

In some implementations, generating the output current in block 402 may include receiving a differential input voltage (402A), and generating a differential output current based at least in part on the first transconductance (402B). The output current may be generated by two or more MOSFETs Q1-Q4 provided within the amplifier 210. In some aspects, a fundamental current of the output current may be less than a fundamental current of the second distortion current.

In some implementations, the second distortion current in block 404 may be generated by first and second transistors Q5-Q6 provided in the distortion compensator 300 and biased by a current source IS1. In some aspects, the first and second transistors Q5-Q6 may have a different aspect ratio as compared to the two or more MOSFETs Q1-Q4 of the CMOS amplifier 210. In addition, or in the alternative, the first and second transistors Q5-Q6 may be diode-connected MOSFETs configured to split current from the current source IS1.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus comprising:
   an amplifier configured to generate an output current based on a first transconductance, wherein the output current includes a first distortion current; and
   a distortion compensator including:
      a first transistor biased by a current source; and
      a second transistor biased by the current source and configured to generate a second distortion current based on a second transconductance, wherein the second transconductance is less than the first transconductance, and wherein the first transistor and the second transistor include diode-connected metal-oxide silicon field effect transistors (MOSFETs) configured to split current from the current source.

2. The apparatus of claim 1, wherein the second distortion current reduces the first distortion current in the output current.

3. The apparatus of claim 1, wherein the amplifier is configured to receive a differential input voltage and generate a differential output current based at least in part on the first transconductance.

4. The apparatus of claim 1, wherein the amplifier comprises two or more metal-oxide-silicon field effect transistors (MOSFETs) configured to generate the output current based on the first transconductance.

5. The apparatus of claim 1, wherein the first transistor and the second transistor have a different aspect ratio compared to two or more MOSFETs in the amplifier.

6. The apparatus of claim 1, wherein a current provided by the current source is not more than $\frac{1}{20}$th of a bias current in two or more MOSFETs of the amplifier.

7. The apparatus of claim 1, wherein a fundamental current of the distortion compensator is less than a fundamental current of the amplifier.

8. The apparatus of claim 1, wherein the second distortion current is based on a third-harmonic of the output current of the distortion compensator.

9. A method of operating an apparatus including at least an amplifier and a distortion compensator, the method comprising:
   generating an output current in the amplifier based on a first transconductance, wherein the output current includes a first distortion current; and
   generating a second distortion current in the distortion compensator based on a second transconductance, wherein the second transconductance is less than the first transconductance, wherein the second distortion current is generated by a first transistor and a second transistor biased by a current source, the first transistor and the second transistor being diode-connected metal-oxide-silicon field effect transistors (MOSFETs) configured to split current from the current source and provided within the distortion compensator.

10. The method of claim 9, wherein the second distortion current reduces the first distortion current in the output current.

11. The method of claim 9, wherein generating the output current further comprises:
   receiving a differential input voltage; and
   generating a differential output current based at least in part on the first transconductance.

12. The method of claim 9, wherein the output current is generated by two or more metal-oxide-silicon field effect transistors (MOSFETs) provided within the amplifier.

13. The method of claim 9, wherein the first transistor and the second transistor have a different aspect ratio compared to two or more MOSFETs within the amplifier.

14. The method of claim 9, wherein a current provided by the current source is not more than $\frac{1}{20}$th of a bias current in two or more MOSFETs within the amplifier.

15. The method of claim 9, wherein a fundamental current of the output current is less than a fundamental current of the second distortion current.

16. The method of claim 9, wherein the second distortion current is based on a third-harmonic of the output current.

* * * * *